United States Patent [19]
Bae

[11] Patent Number: 5,280,640
[45] Date of Patent: Jan. 18, 1994

[54] HIGH SPEED AUTOMATIC FREQUENCY TUNING METHOD

[75] Inventor: Tae-seok Bae, Taejeon, Rep. of Korea

[73] Assignee: SamSung Electronics Co. Ltd., Suwon, Rep. of Korea

[21] Appl. No.: 684,794

[22] Filed: Apr. 15, 1991

[30] Foreign Application Priority Data

Apr. 28, 1990 [KR] Rep. of Korea ............... 90-1468

[51] Int. Cl.$^5$ ............................................. H04B 1/16
[52] U.S. Cl. ............................ 455/182.3; 455/184.1; 455/185.1; 358/193.1
[58] Field of Search .......... 455/164.2, 164.1, 179.1, 455/182.1, 182.3, 183.2, 184.1, 185.1, 186.1, 192.3; 358/193.1

[56] References Cited

U.S. PATENT DOCUMENTS

| | | | |
|---|---|---|---|
| 4,271,434 | 6/1981 | Sakamoto | 358/193.1 |
| 4,357,632 | 11/1982 | French | 358/193.1 |
| 4,364,094 | 12/1982 | French et al. | 358/193.1 |
| 4,397,038 | 8/1983 | Rzeszewski | 455/183 |
| 4,429,415 | 1/1984 | Chin et al. | 455/164.1 |
| 4,451,850 | 5/1984 | Kamemoto | 358/191.1 |
| 4,594,611 | 6/1986 | Sugibayashi et al. | 358/193.1 X |
| 4,763,195 | 8/1088 | Tults | 358/193.1 |
| 4,805,230 | 2/1989 | Tanaka | 455/182.3 |
| 4,819,069 | 4/1989 | Tanaka | 455/182.3 |

Primary Examiner—Reinhard J. Eisenzopf
Assistant Examiner—Chi H. Pham
Attorney, Agent, or Firm—Robert E. Bushnell

[57] ABSTRACT

A high speed automatic frequency tuning method for effectively tuning a broadcasting frequency of a channel selected by a viewer by moving a tuning control frequency in one direction in either a high or low band direction of a reference search frequency, in accordance with the magnitudes between the reference search frequency and an active broadcasting frequency.

8 Claims, 3 Drawing Sheets

HIGH SPEED AUTOMATIC FREQUENCY TUNING METHOD

FIELD OF THE INVENTION

The present invention relates to a method for controlling a tuner in a video receiving apparatus, and more particularly to a method for frequency tuning of a broadcasting frequency of a broadcasting channel at a high speed.

BACKGROUND OF THE INVENTION

Generally, a video receiving apparatus is an apparatus for receiving and displaying a video program transmitted from a broadcasting station through air, such as a television, or a video tape recorder (hereinafter, referred to as a "VTR"), etc.

Accordingly, a small-sized processor that has recently been developed and is commonly used in televisions or VTRs comprises amplitude of additional functions in order to increase the efficiencies of the processor in controlling the televisions and the VTRs as well as to accommodate the viewer's desire to have greater commands of the processor.

Accordingly, the video receiving apparatus has been converted so that the tuning of a broadcasting frequency for a broadcasting channel selected by a viewer is automatically carried out by the processor.

However, up to now, the automatic frequency tuning method used in the video receiving apparatus has a problem in requiring an extensive amount of time to execute the frequency tuning process, which will be described with reference to the attached drawings FIGS. 1 to 3.

FIG. 1 is a flow chart of a conventional automatic frequency tuning method, FIG. 2 is a state diagram of the frequency tuning according to the flow chart shown in FIG. 1, and FIG. 3 is a block diagram of a VTR, which is a diagram of the circuit for carrying out the flow chart shown in FIG. 1.

For convenience, the circuit shown in FIG. 3 will be described. A microcomputer 300 controls and processes the system. A key input means 310 which may be a keyboard, or a remote controlled receiver, etc. receives a key input data representative of an order for the function selected by a viewer, information about channels, and any other needed control information, and then transfers the key input data to the microcomputer 300. After selecting an arbitrary radio frequency signal among a plurality of radio frequency (hereinafter, referred to as "RF") signals receiving through a RF converter 350 under the control of the microcomputer 300, a tuner 320 frequency-converts the selected radio frequency signal and supplies the frequency-converted intermediate frequency signal to a demodulator 330. Then the demodulator 330 demodulates the intermediate frequency signal supplied from the tuner 320, supplies the demodulated video and audio signals to a signal processor 340, and generates an automatic frequency tuning signal having different logic states according to the magnitudes of the frequency of the intermediate frequency signal and a reference demodulation frequency, and then supplies the automatic frequency tuning signal to the microcomputer 300. The signal processor 340 records video and audio signals entering from the demodulator 330 on a recording medium or reproduces the video and audio signals recorded on the recording medium to be supplied to the RF converter 350. The RF converter 350 modulates the video and audio signals entering from the signal processor 340 into radio frequency signals of the frequency band corresponding to television channels 3 or 4, to be output through a connector OPT, and also outputs the radio frequency signal, received through an antenna ANT, through the connector OPT according to a television/VTR mode selection switch, or supplies it to the tuner 320.

A flow chart shown in FIG. 1 is carried out by the microcomputer 300 to be described with reference to the circuit shown in FIG. 3 and the state diagram of the tuning frequency shown in FIG. 2 as follows.

When the key input data for a channel information selected by a viewer is received from the key input means 310, the microcomputer 300 initiates a frequency search mode to enable a flag X assigned in one of its registers as "0" to set to a high frequency search mode such as 20 shown in FIG. 2, and initiates a frequency increase number N stored in one of its registers as "0" (in step 100).

After the processing step 100, the microcomputer 300 reads out a reference search frequency $f_o$ for channel information corresponding to the key input data among reference search frequencies for respective channel information stored in its ROM, and then sets the read reference search frequency $f_o$ as a reference tuning control frequency $f_{to}$, and then supplies the set reference tuning control frequency with a strobe signal of a low logic state to the tuner 320 according to a clock pulse train (in step 101).

After carrying out step 101, the microcomputer 300 checks whether the frequency increase number N stored in one of its registers is equal to a limited increase number 32 (in step 102).

When the frequency increase number N is not equal to the limited increase number 32 in step 102, the microcomputer 300 adds "1" to the frequency increase number N (in step 103).

After processing step 103, the microcomputer 300 stores a logic state of the automatic frequency tuning signal supplied from the demodulator 330 in its RAM (in step 104).

After carrying out step 104, the microcomputer 300 multiplies the frequency increase number N by a unit frequency of 0.0625 MHz, and then adds the product to the reference tuning control frequency $f_{to}$ to set a tuning control frequency $f_t$, and then supplies the set tuning control frequency to the tuner 320 (in step 105).

After carrying out step 105, microcomputer 300 checks whether the logic state of the automatic frequency tuning signal entering from the demodulator 330 is equal to that of the automatic frequency tuning signal stored in its RAM, and if they are different from each other, a completion of the tuning process is determined and the automatic frequency tuning operation is completed. On the other hand, if they are equal, the microcomputer goes back to step 102 (in step 106).

And when the frequency increase number N is the limited increase number 32 in step 102, the microcomputer 300 checks whether the frequency search mode flag X assigned in one of its registers is set to "1", thereby determining whether the low frequency search mode has been set (in step 107).

When the frequency search mode flag X is reset to "0" in step 107, i.e., when it is a high frequency search mode such as 20 of FIG. 2, the microcomputer 300 sets the frequency search mode flag X to "1", so as to set a low frequency search mode such as 21 of FIG. 2, and sets the set reference tuning control frequency $f_{to}$, which has been set in step 101, to be smaller than the reference search frequency by 2 MHz, and initiates the frequency increase number N as "0", and then goes back to step 105 (in step 108).

Inversely, when the frequency search mode flag X is set to "1" in step 107, i.e. when a low frequency search mode is set, the microcomputer 300 sets the reference search frequency $f_o$ as a tuning control frequency $f_t$ to be supplied to the tuner 320, and then completes the automatic frequency tuning operation (in step 109).

Thus, as indicated by the flow chart shown in FIG. 1, the search mode of a frequency band lower than the reference search frequency $f_o$ corresponding to a channel by approximately 2 MHz is set in steps 100 and 101, and a broadcasting frequency for the channel is searched in the frequency band within 2 MHz from the reference search frequency according to the set search mode in steps 102 to 106, and when the broadcasting frequency can not be found in the frequency band within $\pm 2$ MHz with reference to the reference search frequency, the reference search frequency is fixed and set as a tuning control frequency so as to complete the tuning operation in step 109.

As described above with reference to FIGS. 1 to 3, the conventional automatic frequency tuning method sets low and high band search modes, and carries out a search process of 32 steps of increments or decrements from the reference search frequency $f_o$ to each limited frequency $f_o \pm 2$ MHz by a constant frequency according to each set mode, without regarding the relation between the currently tuned radio frequency signal frequency and the active broadcasting frequency. Thus, in the worst case, the search process of 64 steps is carried out to tune the broadcasting frequency, requiring an extensive amount of time to execute the frequency tuning process.

SUMMARY OF THE INVENTION

Accordingly, it is an object of the present invention to provide a high speed automatic frequency tuning method for frequency tuning of a broadcasting frequency of a broadcasting channel at a high speed in a video receiving apparatus.

To achieve the object, according to the present invention, a method for controlling a tuner in a video receiving apparatus provided with a tuner for tuning an arbitrary a plurality of radio frequency band signal among radio frequency band signals received through an antenna, comprises:

a reference search frequency setting step for setting a reference search frequency corresponding to a broadcast channel selected by a viewer, thereby enabling a tuner to tune the radio frequency signal of the reference search frequency;

a tuning frequency search step for checking whether the frequency of the radio frequency signal tuned in the reference search frequency setting step is greater than the broadcast radio frequency of a selected broadcasting channel, and moving the reference search frequency toward a limited frequency of either a low or a high band by a constant frequency until the frequency of the radio frequency signal tuned in the tuner is equal to the broadcasting radio frequency according to the result of the checking process and then enabling the tuner to tune to the radio frequency signal corresponding to a new reference search frequency; and a compulsive tuning step for controlling the tuner so as to tune the radio frequency signal of a reference search frequency corresponding to the broadcasting radio frequency selected in the reference search frequency setting step when the frequency of the radio frequency signal tuned by the tuner is not equal to the active broadcasting frequency, until the reference search frequency moves to the limited frequency in the tuning frequency search step.

BRIEF DESCRIPTION OF THE DRAWINGS

The above object and other advantages of the present invention will become more apparent by describing the preferred embodiment of the present invention with reference to the attached drawings, in which.

DETAILED DESCRIPTION OF THE INVENTION

Figure 4:
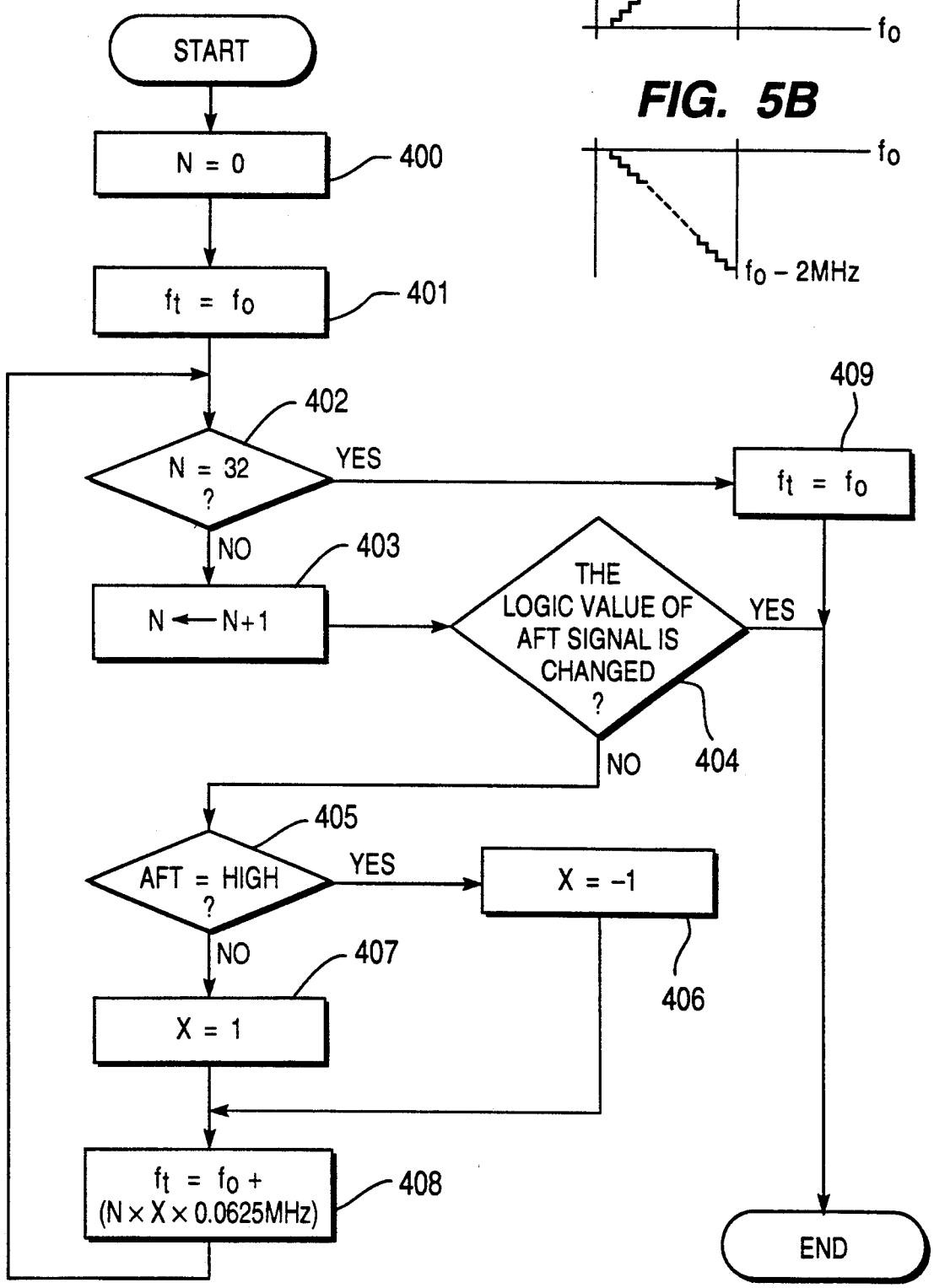
FIG. 4 is a flow chart of an embodiment of the high speed automatic frequency tuning method according to the present invention.

With reference to FIG. 4 which is a flow chart of the high speed automatic frequency tuning method of the present invention, a reference search frequency setting process is carried out in steps 400 and 401, and a tuning frequency search process is carried out in steps 402 to 408, and a compulsive tuning process corresponds to step 409.

Figure 5A:
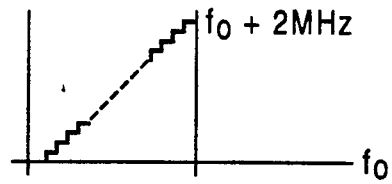
FIGS. 5A and 5B are a state diagrams of a frequency tuning according to the flow chart shown in FIG. 4.
Figure 5B:
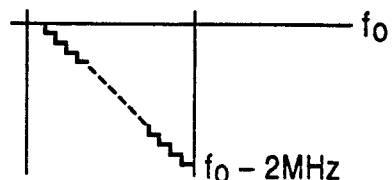

FIGS. 5A and 5B are state diagrams of the frequency tuning according to the flow chart shown in FIG. 4. FIG. 5A is a state diagram of the frequency tuning when the reference search frequency $f_o$ is lower than an active broadcasting frequency, and FIG. 5B is a state diagram of the frequency tuning when the reference search frequency $f_o$ is higher than the active broadcasting frequency.

Successively, the flow chart shown in FIG. 4 will be described in conjunction with the circuit diagram shown in FIG. 3 and the frequency tuning state diagram shown in FIG. 5.

Figure 1:
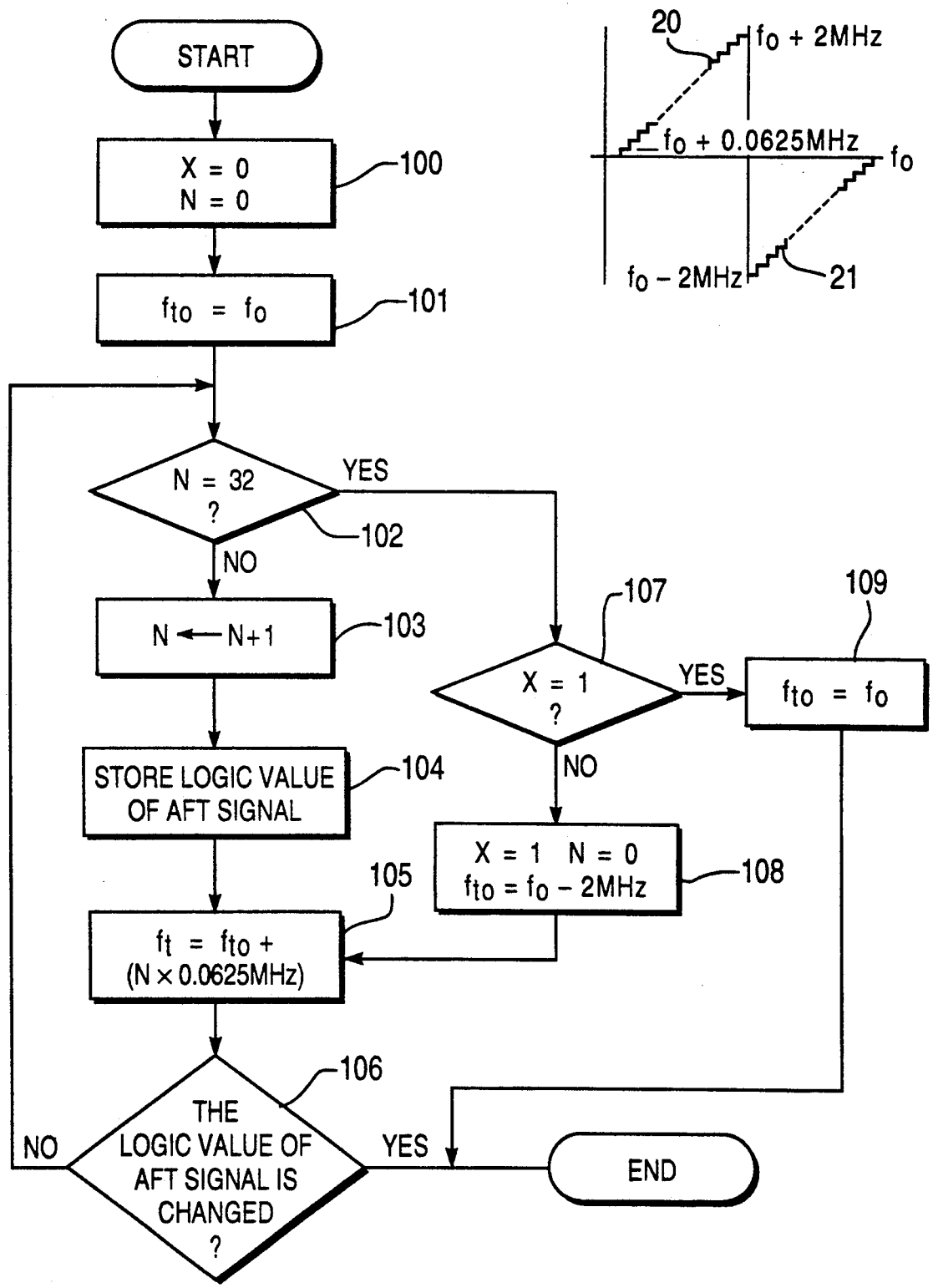
FIG. 1 is a flow chart showing a conventional automatic frequency tuning method.
Figure 2:
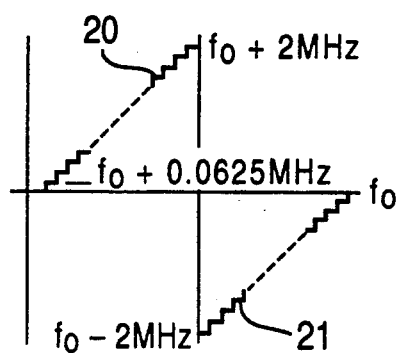
FIG. 2 is a state diagram of frequency tuning according to the flow chart shown in FIG. 1.
Figure 3:
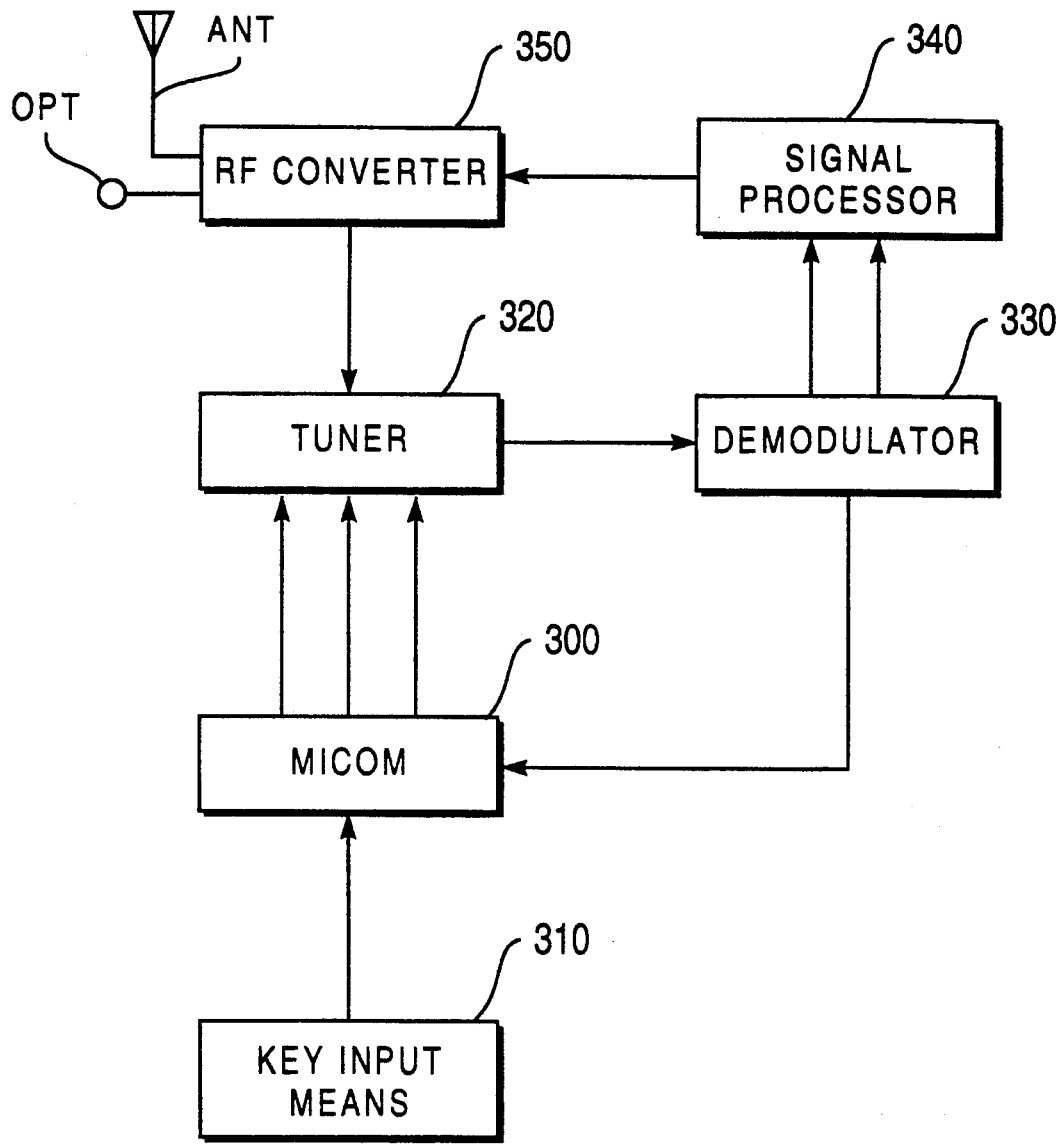
FIG. 3 is a diagram of a circuit for carrying out the flow chart shown in FIG. 1.

The flowchart shown in FIG. 4 is processed by the microcomputer 300 as shown in FIG. 3, when the key input data for a channel information is received from a key input means 310. A flowchart program shown in FIG. 4 is stored in a ROM of the microcomputer 300. Similarly reference search frequencies fo for respective broadcasting channels are stored in the ROM of the microcomputer 300.

The microcomputer 300 initiates a frequency increase number N assigned to one of its registers as "0", when the key input data for a channel information selected by a viewer is input from the key input means 310 (in step 400).

After the processing step 400, the microcomputer 300 reads out the reference search frequency $f_o$ corresponding to the channel information selected by the key input data among a plurality of reference search frequencies $f_o$, for respective channel information stored in its ROM, and sets the read reference search frequency as a tuning control frequency $f_t$, and then supplies the set tuning control frequency $f_t$ to the tuner 320 (in step 401).

After performing step 401, the microcomputer 300 checks whether the frequency increase number N stored in one of its registers is equal to a limited increase number 32 (in step 402).

When the frequency increase number N is not equal to the limited increase number 32 in step 402, the microcomputer 300 increases the frequency increase number N by "1" (in step 403).

After the processing step 403, the microcomputer 300 compares the current logic state of the automatic frequency tuning signal entering from the demodulator 330 with that of the previous automatic frequency tuning signal. If the compared logic states are different from each other, the tuning operation is completed (in step 404).

When the logic state of the current automatic frequency tuning signal is equal to that of the previous automatic frequency tuning signal in step 404, it is checked whether the logic state of the automatic frequency tuning signal entering from the demodulator 330 is in a high logic state in order to determine whether the frequency of the radio frequency signal tuned by the tuning control frequency is higher than an active broadcasting frequency (in step 405).

When the logic state of the automatic frequency tuning signal entering from the demodulator 330 is recognized as a high logic state via step 405, i.e. when the frequency of the radio frequency signal tuned by the tuning control frequency is higher than the active broadcasting frequency, the microcomputer 300 sets a search direction mode flag X initially assigned to one of its registers as "−1" to a low band search mode (in step 406).

When the logic state of the automatic frequency tuning signal entering from the demodulator 330 is recognized as a low logic state via step 405, i.e. when the frequency of the radio frequency signal tuned by the tuning control frequency is lower than the active broadcasting frequency, the microcomputer 300 sets the search direction mode flag X assigned to one of its registers as "1" to a high band search mode (in step 407).

After performing step 406 or step 407, the microcomputer 300 multiplies the frequency increase number N by a constant increase frequency of 0.0625 MHz, and then subtracts the product from the reference search frequency or adds the product to the reference search frequency according to the logic state of the search direction mode flag X set in step 406 or step 407 so as to set the tuning control frequency, and then supplies the set tuning control frequency to the tuner 320, and then goes back to the step 402 (in step 408).

On the other hand, when the frequency increase number N is equal to the limited increase number 32 in step 402, the microcomputer 300 sets the reference search frequency $f_o$ corresponding to the selected broadcasting channel as a tuning control frequency $f_t$, and then supplies the set tuning control frequency to the tuner 320, thereby completing the tuning operation (in step 409).

In conclusion, the flow chart shown in FIG. 4 checks whether the frequency of a radio frequency signal tuned by a tuning control frequency corresponding to a channel information selected at the beginning is greater than an active broadcasting frequency, and then searches the active broadcasting frequency by moving the tuning control frequency by a constant amount in one direction to the limited frequency $f_o \pm 2$ MHz of the low band as shown in FIG. 5B or of the high band as shown in FIG. 5A with respect to the reference search frequency.

As described above, the present invention compares the magnitudes between the frequency of a radio frequency signal and the active broadcasting frequency, and tunes the active broadcasting frequency by moving the tuning control frequency in one direction of the low or high band with respect to the reference search frequency corresponding to the channel selected by the viewer according to the compared result, so that an amount of time needed to execute the automatic frequency tuning process can be reduced.

What is claimed is:

1. A method for controlling a tuner in a video receiving apparatus for tuning an radio frequency signal from a plurality of radio frequency signals received through an antenna, comprising:

a reference search frequency setting step for setting a reference search frequency corresponding to a broadcasting channel selected by a viewer to enable the tuner to tune to a radio frequency signal corresponding to the reference search frequency;

a tuning frequency search step for making a determination of whether a frequency of the radio frequency signal tuned in by said tuner is greater or less than a broadcasting frequency of the selected broadcasting channel, and moving the reference search frequency within a predetermined number of frequency steps in one of an increasing direction and a decreasing direction from said reference search frequency, until the frequency of the radio frequency signal tuned by the tuner is equal to the broadcasting frequency of the selected broadcasting channel, in dependence upon said determination, to thereby enable the tuner to tune to the radio frequency signal corresponding to the moved reference search frequency; and a compulsive tuning step for controlling said tuner to tune to the radio frequency signal of said reference search frequency corresponding to the selected broadcasting channel when the frequency of the radio frequency signal tuned by the tuner is not equal to the broadcasting frequency, until the reference search frequency reaches a limited frequency defined by the predetermined number of frequency steps in said tuning frequency search step.

2. A method for controlling a tuner provided for tuning an arbitrary radio frequency signal among a plurality of radio frequency signals, comprising the steps of:

setting a reference search frequency corresponding to a broadcast channel selected by a viewer;

making a determination of whether a frequency corresponding to a radio frequency signal tuned in said reference search frequency setting step currently being received is higher or lower than an active frequency of the selected broadcast channel;

incrementing the reference search frequency by a constant frequency step for a predetermined number of frequency steps if the radio frequency signal currently being received is lower than the active frequency of the selected broadcast channel, or decrementing the reference search frequency by a constant frequency step for said predetermined number of frequency steps if the radio frequency signal currently being received is higher than the active frequency of the selected broadcast channel, until the frequency of the radio frequency signal currently being received is equal to the active frequency of the selected broadcast channel; and controlling said tuner to tune to the radio frequency signal of said reference search frequency corresponding to the selected broadcast channel when the frequency of the radio frequency signal currently being received is not equal to the active frequency of the selected broadcast channel, until the reference search frequency reaches a limited frequency defined by said predetermined number of frequency steps.

3. A method for automatic fine tuning of a broadcast channel from a plurality of broadcast channels in a tuner, comprising the steps of:

reading a reference search frequency from a plurality of reference search frequencies corresponding an active broadcast frequency of a broadcast channel selected by a viewer;

setting said reference search frequency as a tuning control frequency;

setting a maximum number of frequency steps from said reference search frequency in one of a frequency increasing direction and a frequency decreasing direction, within a defined bandwidth of said broadcast channel, for determining an existence of said active broadcast frequency;

making a determination of whether a frequency of a radio frequency signal tuned by said tuning control frequency is the active broadcast frequency of said broadcast channel in dependence upon a comparison of the frequency of the radio frequency signal tuned by said tuning control frequency and said tuning control frequency;

tuning to the active broadcast frequency of said broadcast channel by either increasing said tuning control frequency on a step-by-step basis to said maximum number of frequency steps, within said defined bandwidth of said broadcast channel in said frequency increasing direction, if the frequency of the radio frequency signal tuned by said tuning control frequency is lower than the active broadcast frequency of said broadcast channel, or by decreasing said tuning control frequency on the step-by-step basis to said maximum number of frequency steps, within said defined bandwidth of said broadcast channel in said frequency decreasing direction, if the frequency of the radio frequency signal tuned by said tuning control frequency is higher than the active broadcast frequency of said broadcast channel; and completing the tuning of the active broadcast frequency of said broadcast channel in dependence upon occurrence of a first to occur of one of the frequency of the radio frequency signal tuned by said tuning control frequency being equal to the active broadcast frequency of said broadcast channel, and the tuning control frequency being increased or decreased on the step-by-step basis until said maximum number of frequency steps is reached, within said defined bandwidth of said broadcast channel in one of said frequency increasing direction and said frequency decreasing direction.

4. The method for automatic fine tuning of a broadcast channel as claimed in claim 3, wherein each frequency step is 0.0625 MHz, said predetermined number of frequency steps is 32, and said defined bandwidth of said broadcast channel is ±2 MHz from the reference search frequency.

5. A method for automatic fine tuning of a broadcast channel from a plurality of broadcast channels of a tuner by a microcomputer, comprising the steps of:

initializing a frequency increase number when a broadcast channel is selected by a viewer, said frequency increase number having a set upper limit;

reading a reference search frequency from a plurality of reference search frequencies corresponding an active broadcast frequency of the broadcast channel;

setting a tuning control frequency equals to said reference search frequency to enable the tuner to tune to a radio frequency signal corresponding to the reference search frequency;

checking whether the frequency increase number reaches the set upper limit;

increasing the frequency increase number by a constant if the frequency increase number has not reached the set upper limit;

making a first determination of whether logic values of a current automatic fine tuning signal and a previous automatic fine tuning signal change in dependence upon a comparison of a frequency of a currently tuned radio frequency signal tuned by the tuner and the set tuning control frequency;

making a second determination of whether a logic value of the current automatic fine tuning signal indicates that the currently tuned radio-frequency signal tuned by the tuner is higher or lower than the active broadcast frequency in dependence upon said first determination;

setting a search mode direction in one of a low band search direction and a high band search direction from the reference search frequency in dependence upon said second determination, said low band search direction representing the frequency of the currently tuned radio frequency signal tuned by the tuner being higher than the active broadcast frequency, and said high band search direction representing the frequency of the currently tuned radio frequency signal tuned by the tuner being lower than the active broadcast frequency;

moving the tuning control frequency in one of the low band search direction and the high band search direction by increasing the frequency increase number until the frequency increase number reaches the set upper limit; and completing the tuning of the active broadcast frequency of said broadcast channel in dependence upon occurrence of a first to occur of one of the frequency of the currently tuned radio frequency signal tuned by the tuner being equal to the active broadcast frequency of said broadcast channel, and the frequency increase number reaching the set upper limit.

6. The method for automatic fine tuning of a broadcast channel as claimed in claim 5, wherein the set upper limit of the frequency increase number is 32.

7. The method for automatic fine tuning of a broadcast channel as claimed in claim 5, further comprising the step of terminating the tuning of the active broadcast frequency of said broadcast channel if the logic values of the current automatic fine tuning signal and the previous automatic fine tuning signal do not change in said first determination.

8. An automatic fine tuning system, comprising:
- a tuner for tuning for an arbitrary radio-frequency signal from a plurality of radio-frequency signals via an antenna, and for converting the tuned radio-frequency signal into an intermediate-frequency signal;
- a demodulator for demodulating said intermediate-frequency signal to generate demodulated audio and video signals and an automatic frequency tuning signal;
- a signal processor for processing said demodulated audio and video signals to provide processed signals by recording said demodulated audio and video signals on a recording medium and reproducing the demodulated audio and video signals from said recording medium;
- a RF converter for modulating said processed signals into a radio-frequency signal having a frequency band corresponding to a selected television channel; and
- controller means responsive to said automatic frequency tuning signal, for controlling said tuner to automatic fine tune of said arbitrary radio-frequency signal among said plurality of radio-frequency signals by:
  - setting a reference search frequency corresponding to a broadcast channel selected by a viewer;
  - making a determination of whether a frequency corresponding to the tuned radio-frequency signal currently received is higher or lower than an active frequency of the selected broadcast channel in dependence upon a comparison of the frequency of the tuned radio-frequency signal currently received and the set tuning control frequency;
  - incrementing the reference search frequency by a constant frequency step for a predetermined number of frequency steps if the tuned radio-frequency signal currently being received is lower than the active frequency of the selected broadcast channel, or decrementing the reference search frequency by a constant frequency step for said predetermined number of frequency steps if the tuned radio-frequency signal currently being received is higher than the active frequency of the selected broadcast channel, until the frequency of the tuned radio-frequency signal currently being received is equal to the active frequency of the selected broadcast channel; and
  - controlling said tuner to tune to the arbitrary radio-frequency signal of said reference search frequency corresponding to the selected broadcast channel when the frequency of the tuned radio-frequency signal currently being received is not equal to the active frequency of the selected broadcast channel, until the reference search frequency reaches a limited frequency defined by said predetermined number of frequency steps.

* * * * *

UNITED STATES PATENT AND TRADEMARK OFFICE
CERTIFICATE OF CORRECTION

PATENT NO. : 5,280,640
DATED : January 18, 1994
INVENTOR(S) : Tae-Seok Bae

It is certified that error appears in the above-indentified patent and that said Letters Patent is hereby corrected as shown below:

On the title page:

IN ITEM [30], Foreign Application Priority Data–Yang Lack, KIM--.

change "90-1468" to --90-6048--

Column 1,    line 20, change "amplitude" to --a multitude--;

Column 3,    line 51, after "arbitrary", delete "a plurality of";

line 52, preceding "radio", insert --a plurality of--;

line 57, after "tune", insert --to --.

Column 4,    line 27, after "are", delete "a";

line 56, after "Similarly", insert comma --,--.

and then insert --the-- after "frequencies", change "fo" to --$f_o$--;

UNITED STATES PATENT AND TRADEMARK OFFICE
CERTIFICATE OF CORRECTION

PATENT NO. : 5,280,640
DATED : January 18, 1994
INVENTOR(S) : Tae-Seok Bae

It is certified that error appears in the above-indentified patent and that said Letters Patent is hereby corrected as shown below:

Column 6, line 18, preceding "radio", change "an" to --a--:

Signed and Sealed this

Ninth Day of July, 1996

Attest:

BRUCE LEHMAN

*Attesting Officer*     *Commissioner of Patents and Trademarks*